(12) United States Patent
Cina

(10) Patent No.: US 8,124,248 B2
(45) Date of Patent: Feb. 28, 2012

(54) LIGHT-EMISSIVE POLYMER BLENDS AND LIGHT-EMISSIVE DEVICES MADE FROM THE SAME

(75) Inventor: Salvatore Cina, Grenoble (FR)

(73) Assignee: Cambridge Display Technology Limited, Cambridgeshire (GB)

( * ) Notice: Subject to any disclaimer, the term of this patent is extended or adjusted under 35 U.S.C. 154(b) by 131 days.

(21) Appl. No.: 11/558,373

(22) Filed: Nov. 9, 2006

(65) Prior Publication Data

US 2007/0154736 A1 Jul. 5, 2007

Related U.S. Application Data

(63) Continuation of application No. 10/398,142, filed as application No. PCT/GB01/04381 on Oct. 2, 2001, now abandoned.

(60) Provisional application No. 60/253,249, filed on Nov. 27, 2000.

(30) Foreign Application Priority Data

Oct. 3, 2000 (GB) .................................. 0024155.4
Jul. 27, 2001 (GB) .................................. 0118368.0

(51) Int. Cl.
*H01L 51/54* (2006.01)
*B32B 19/00* (2006.01)
*C08G 61/00* (2006.01)

(52) U.S. Cl. .................. 428/690; 252/301.35; 428/917; 257/40; 313/504

(58) Field of Classification Search .................. 428/690, 428/917; 313/504; 252/301.35; 257/40
See application file for complete search history.

(56) References Cited

U.S. PATENT DOCUMENTS 5,798,170 A    8/1998    Zhang et al. .................. 428/212

FOREIGN PATENT DOCUMENTS

| WO | WO 99/48160 | 9/1999 |
| WO | WO 99/54385 | 10/1999 |
| WO | WO 00/46321 | 8/2000 |
| WO | WO 00/55927 | 9/2000 |

OTHER PUBLICATIONS

Proceedings of SPIE, vol. 3669, (1999), p. 330-335.*
He et al., "Organic polymer light-emitting devices on the plastic substrates," Proceedings of SPIE—the International Society for Optical Engineering, *SPIE*, 3669:330-335 (1999).
He et al., "High performance organic polymer light-emitting heterostructure devices," *Appl. Phys. Lett.* 74(16):2265-2267 (1999).

He et al., "High-efficiency organic polymer light-emitting heterostructure devices on flexible plastic substrates," *Appl. Phys. Letter*, 76(6):661-663 (2000).
Kawase et al., "Low voltage operation of polymer light-emitting device with conducting polymer distributed Bragg reflector," Materials Research Society Symposium Proceedings, 598 (Electrical, Optical, and Magnetic Properties of Organic Solid-State Materials V), BB11.49/1-BB11.49/6 (2000).
Stoessel et al., "Cathode-induced luminescence quenching in polyfluorenes," *J. Appl. Phy.*, 87(9):4467-4475 (2000).
Zhu et al., "Optimized indium tin oxide contact for organic light emitting diode applications," *Thin Solid Films*, 363:314-317 (2000).
International Search Report for PCT/GB01/04381, dated Jan. 15, 2002.
Written Opinion for PCT/GB01/04381, dated Oct. 1, 2002.
International Preliminary Examination Report for PCT/GB01/04381, dated Feb. 5, 2003.

* cited by examiner

*Primary Examiner* — Dawn L. Garrett
(74) *Attorney, Agent, or Firm* — Marshall, Gerstein & Borun LLP

(57) ABSTRACT

A polymer blend comprising a first, light-emissive polymer comprising substituted or non-substituted units according to formulae (I) and (II) and a second, hole transport polymer comprising substituted or non-substituted fluorene units according to formula (I) and substituted or non-substituted triarylamine units, wherein the molecular weights of the first and second polymers and the blending ratio of the first and second polymers are selected such that, in use in a light-emissive device, the luminance of the emitted light at a bias of 5V is no less than 20,000 cd/m$^2$.

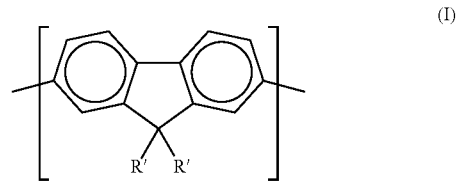

(I)

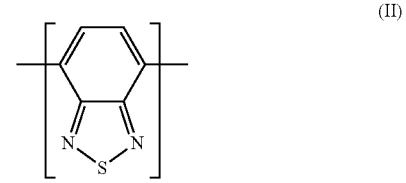

(II)

wherein R' is independently in each occurrence H, $C_1$-$C_{20}$ hydrocarbyl or $C_1$-$C_{20}$ hydrocarbyl containing one or more S, N, O, P or Si atoms, $C_4$-$C_{16}$ hydrocarbyl carbonyloxy, $C_4$-$C_{16}$ aryl(trialkylsiloxy) or both R' may form together with the 9-carbon on the fluorene ring a $C_5$-$C_{20}$ cycloaliphatic structure containing one or more heteroatoms of S, N or O.

11 Claims, 3 Drawing Sheets

LIGHT-EMISSIVE POLYMER BLENDS AND LIGHT-EMISSIVE DEVICES MADE FROM THE SAME

CROSS-REFERENCE TO RELATED APPLICATIONS

This is a continuation of U.S. patent application Ser. No. 10/398,142, filed Jul. 3, 2003, now abandoned, which is the U.S. national phase of International Application No. PCT/GB01/04381 filed Oct. 2, 2001, which claims the benefit under 35 U.S.C. §119(e) of U.S. provisional patent application Ser. No. 60/253,249 filed Nov. 27, 2000, the entire disclosure of which is incorporated herein by reference.

The present invention relates to novel light-emissive polymer blends, and to light-emissive devices made from such blends.

Light-emissive devices typically comprise a layer of electroluminescent material arranged between two electrodes such that charge carriers can move between the electrodes and the light-emissive material. Charge transport layers may be interposed between the layer of electroluminescent material and either or both of the electrodes.

The use of blends of conjugated polymers as the active material in light-emissive devices is disclosed in WO99/48160, WO99/54385 and WO00/46321. For example, WO99/48160 describes a device comprising an active layer comprising a tri-blend of poly(2,7-9,9-di-n-octylfluorene), poly(2,7-(9,9-di-n-octylfluorene)-3,6-benzothiadiazole) and poly(2,7-(9,9-di-n-octylfluorene)-(1,4-phenylene-((4-secbutylphenylimino)-1,4-phenylene)); and WO00/046321 describes a device having an active layer comprising a bi-blend of poly(2,7-(9,9-di-n-octylfluorene)-3,6-benzothiadiazole) and a polymer comprising 9,9-di-n-octylfluorene units, benzothiadiazole units and 1,4-phenylene-((4-secbutylphenylimino)-1,4-phenylene units in a ratio of 3:2:1.

According to a first aspect of the present invention, there is provided a polymer blend comprising a first, light-emissive polymer comprising substituted or non-substituted units according to formulae (I) and (II) and a second, hole transport polymer comprising substituted or non-substituted fluorene units according to formula (I) and substituted or non-substituted triarylamine units, wherein the molecular weights of the first and second polymers and the blending ratio of the first and second polymers are selected such that, in use in a light-emissive device, the luminance of the emitted light at a bias of 5V is no less than 20,000 cd/m².

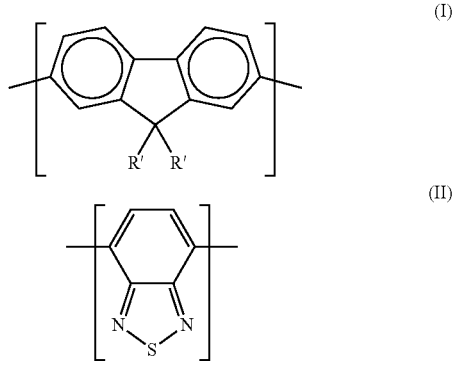

wherein R' is independently in each occurrence H, $C_1$-$C_{20}$ hydrocarbyl or $C_1$-$C_{20}$ hydrocarbyl containing one or more S, N, O, P or Si atoms, $C_4$-$C_{16}$ hydrocarbyl carbonyloxy, $C_4$-$C_{16}$ aryl(trialkylsiloxy). For example, each R' may be an alkyl group or an aryl group such as phenyl or biphenyl. Alternatively, both R' may form together with the 9-carbon on the fluorene ring a $C_5$-$C_{20}$ cyclic such as a cycloaliphatic or a cycloaromatic structure optionally containing one or more heteroatoms of S, N or O. For example, R' may together form an additional fluorene ring to form a spirofluorene unit.

In one embodiment, the polymer blend consists essentially of the first and second polymers.

The luminance valve specified above refers to the luminance in a device of the kind described in detail hereafter.

According to a second aspect of the present invention, there is provided a polymer blend consisting essentially of a first, light-emissive polymer comprising substituted or non-substituted units according to formulae (I) and (II) below and a second, hole transport polymer consisting essentially of substituted or non-substituted fluorene units according to formula (I) and substituted or non-substituted triarylamine units, and optionally one or more further hole transport polymers different to the second polymer.

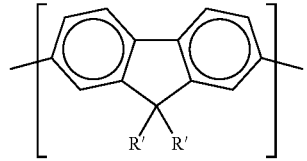

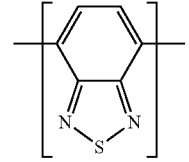

wherein R' is independently in each occurrence H, $C_1$-$C_{20}$ hydrocarbyl or $C_1$-$C_{20}$ hydrocarbyl containing one or more S, N, O, P or Si atoms, $C_4$-$C_{16}$ hydrocarbyl carbonyloxy, $C_4$-$C_{16}$ aryl(trialkylsiloxy) or both R' may form together with the 9-carbon on the fluorene ring a $C_5$-$C_{20}$ cyclic structure optionally containing one or more heteroatoms of S, N or O.

The fluorene unit may also optionally be substituted at one or more other positions by a group selected from $C_1$-$C_{20}$ hydrocarbyl, $C_1$-$C_{20}$ hydrocarbyloxy, $C_1$-$C_{20}$ thioether, $C_1$-$C_{20}$ hydrocarbylcarbonyloxy or cyano. The fluorene unit is preferably unsubstituted (i.e. has hydrogen atoms) at all other positions.

The benzothiadiazole unit may also be optionally substituted at either or both the carbons available for substitution with groups independently selected from $C_1$-$C_{20}$ hydrocarbyl, particularly $C_1$-$C_{20}$ alkyl, or $C_1$-$C_{20}$ hydrocarbyl containing one or more S, N, O, P or Si atoms, $C_4$-$C_{16}$ hydrocarbyl carbonyloxy, $C_4$-$C_{16}$ aryl(trialkylsiloxy). It is preferably unsubstituted, i.e. has hydrogen atoms at each of the two carbon atoms available for substitution.

The triarylamine unit preferably comprises two aryl groups that are linked together by a nitrogen atom and form part of the polymer chain and a third aryl group which is also bonded to the nitrogen atom and is pendant from the polymer chain. The triarylamine unit may be substituted at one or more positions on the pendant aryl group with one or more groups R" independently selected from $C_1$-$C_{20}$ alkyl (particularly trifluoromethyl), $C_1$-$C_{20}$ alkoxy or a group of the formula —$CO_2$R''' wherein R''' is a $C_1$-$C_{20}$ alkyl.

The term "hole transport polymer" refers to a polymer which conducts mainly holes inside the polymer blend.

The proportion of the first polymer in the polymer blend is preferably in the range of 50 to 75 weight percent, further preferably in the range of 60 to 70 weight percent.

The first polymer preferably has a peak molecular weight (Mp) in the range of 150,000 to 300,000, and a number-average molecular weight (Mn) in the range of 70,000 to 180,000, as measured by size exclusion chromatography calibrated with polystyrene standard.

If the device is used as part of a passive matrix display, it is preferred that the proportion of the first polymer in the polymer blend is at least 70%.

According to another aspect of the present invention, there is provided a light-emissive device comprising a layer of a light-emissive material interposed between first and second electrodes such that charge carriers can move between the first and second electrodes and the light-emissive material, wherein the light-emissive material comprises a polymer blend according to either the first or second aspects of the present invention. According to another aspect of the present invention, there is provided a passive matrix display comprising such a light-emissive device.

BRIEF DESCRIPTION OF THE DRAWINGS

An embodiment of the present invention is described hereunder, by way of example only, with reference to the accompany drawings, in which:

With reference to FIG. 1, a device according to an embodiment of the present invention has a glass substrate 1, a patterned ITO layer (16 mm² pixel) 2 provided on the glass substrate, a layer of a hole transport polymer such as polyethylene dioxythiophene doped with polystyrene sulphonic acid (PEDOT:PSS) 3 provided on the ITO-patterned glass substrate, a layer 4 of a polymer blend consisting of 70 weight percent of an alternating polymer of 9,9'-dioctylfluorene units and benzothiadiazole units (F8BT) as shown in FIG. 4a, and 30 weight percent of an alternating polymer of 9,9'-dioctylfluorene units and triphenylamine units (TFB) as shown in FIG. 4b formed over the hole transport polymer layer, and a cathode 5 formed on the polymer blend layer 4.

The F8BT polymer has an $M_p$ of 220,000 and an $M_w$ of 123,000; and the TFB polymer has an $M_p$ of 102,000 and an $M_w$ of 52,000. The $M_p$ and $M_w$ were measured by GPC in tetrahydrofuran against a polystyrene standard.

The PEDOT:PSS layer is deposited on the ITO-patterned substrate from a solution composed of PEDOT(10):PSS (1.45):$H_2O$(8) to a thickness of about 65 nm. The thickness of the polymer blend layer 4 is also about 65 nm. The polymer blend is also deposited by spin coating. The cathode comprises a 30 nm layer of calcium capped with a 300 nm layer of aluminum. The cathode is deposited by evaporation.

In another embodiment, the cathode may include a layer of samarium, ytterbium or cerium instead of calcium (samarium is a preferred alternative for calcium) and/or may further comprise a layer of lithium fluoride interposed between the layer of calcium and the polymer blend layer 4.

The device described above exhibits high peak efficiency and low turn-on voltage (1.9V).

Figure 1:
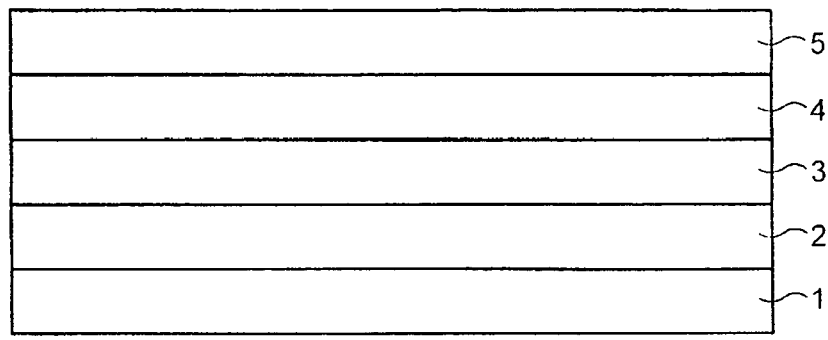
FIG. 1 is a schematic view of a light-emissive device.
Figure 2:
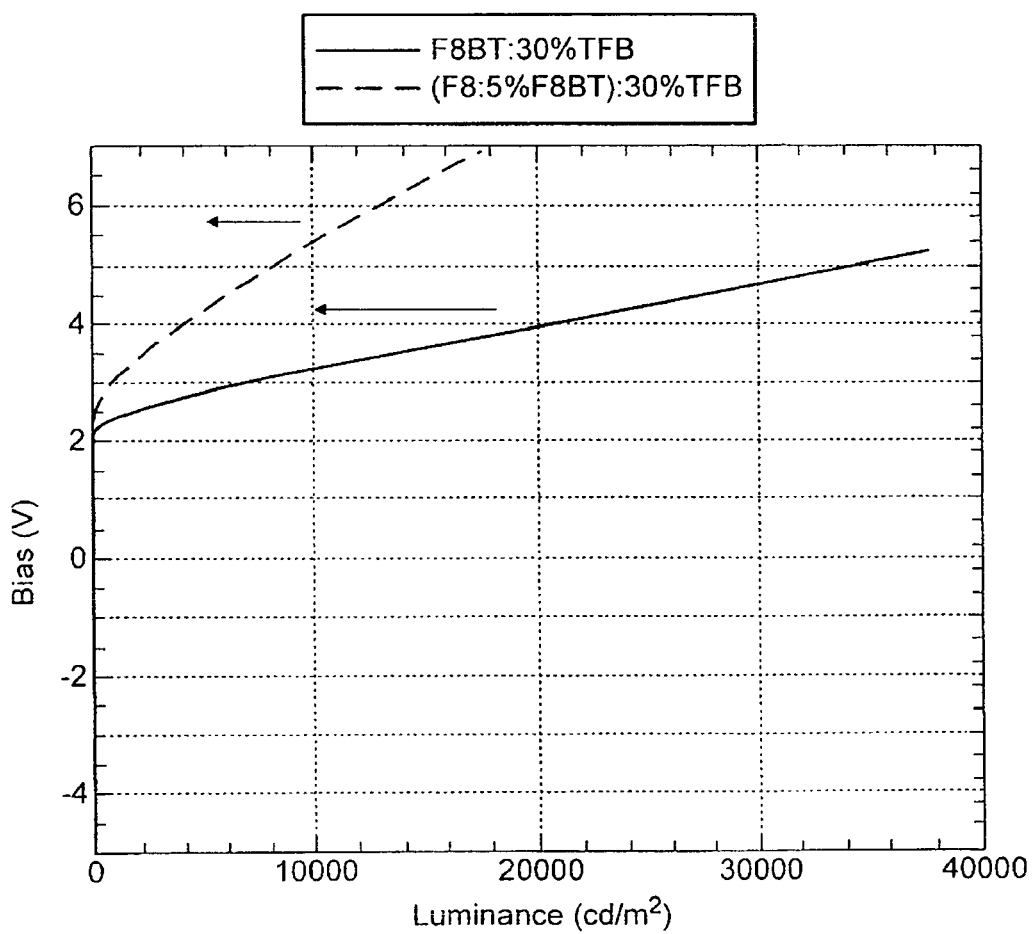
FIGS. 2 and 3 are graphs showing the improved performance of a device according to the present invention compared to a conventional device.

FIG. 2 clearly shows that the same brightness can be achieved at a lower voltage compared to the conventional device. For example, the brightness achieved is 10000 Cd/m² at 3.2V (or 1000 Cd/m² at 2.3V) and 35000 Cd/m² at 5V. As shown in FIG. 2, these brightnesses are much larger than those obtained at the same voltages with a corresponding device having an active layer made from a conventional polymer blend comprising a polyfluorene, a fluorene-benzothiadiazole copolymer and a fluorene-triarylamine copolymer.

Figure 3:
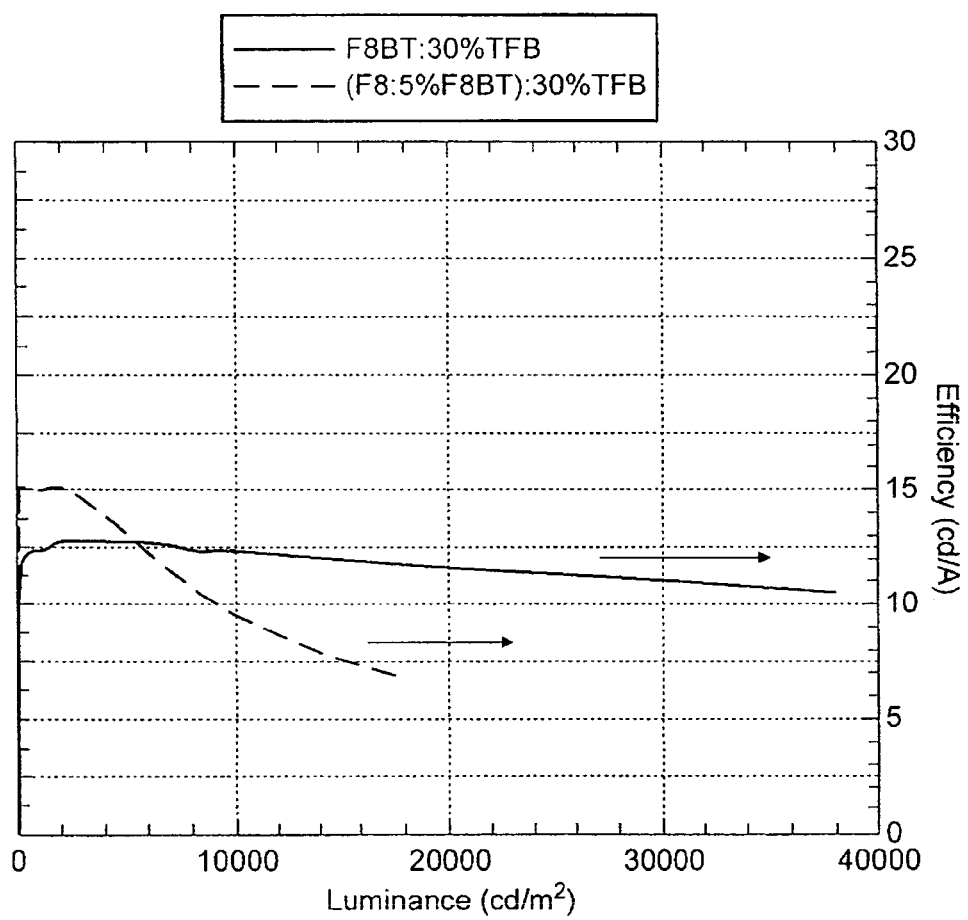
Figure 4A:
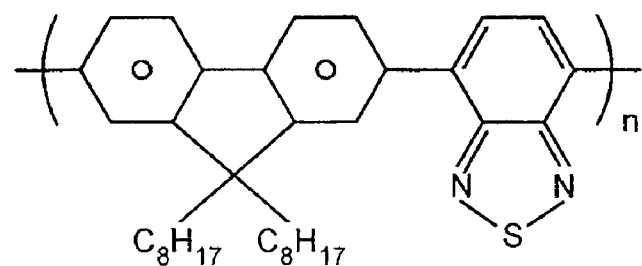
FIG. 4 shows the structure of the component polymers of a polymer blend according to an embodiment of the present invention.
Figure 4B:
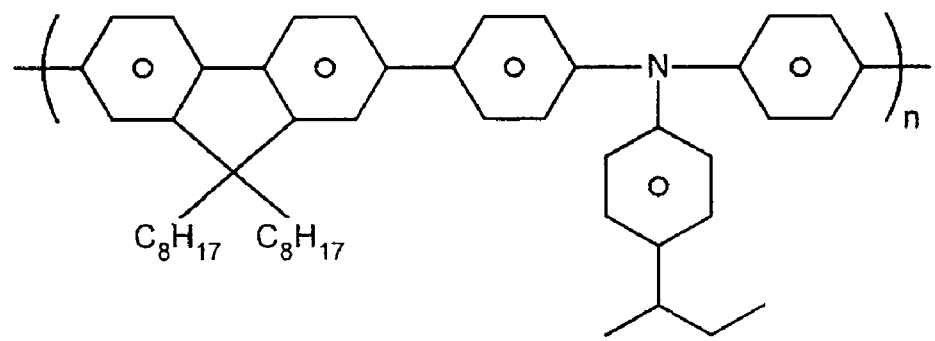

Furthermore, as is clear from FIG. 3, the drop-off in efficiency with increasing brightness is less pronounced compared to the conventional device.

The luminance and efficiency values are based on a measurement using a silicon photodiode of the amount of emitted light transmitted through the glass substrate. Any emitted light that is waveguided within the device and is transmitted out of the device other than through the glass substrate is not taken into account.

This improved performance is particularly significant in the context of pulsed passive matrix displays. All other things being equal, capacitative loss in these displays is proportional to $V^2$, where V is the drive voltage. The capability to use a lower drive voltage to achieve the same brightness is highly desirable from the point of view of minimising power dissipation, and may help to simplify the construction of the drive circuit.

The invention claimed is:

1. A polymer blend comprising a first, light-emissive polymer comprising substituted or non-substituted units according to formulae (I) and (II), and a second, hole transport polymer consisting of alternating single repeat units (a) and (b), said single repeat unit (a) comprising a substituted or non-substituted fluorene unit according to formula (I) and said single repeat unit (b) comprising a substituted or non-substituted triarylamine unit, wherein the molecular weights of the first and second polymers and the blending ratio of the first and second polymers are selected such that, in use in a light-emissive device, the luminance of the emitted light at a bias of 5V is no less than 20,000 cd/m²

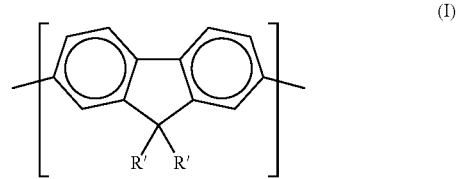

(I)

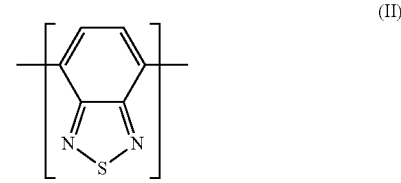

(II)

wherein R' is independently in each occurrence H, $C_1$-$C_{20}$ hydrocarbyl or $C_1$-$C_{20}$ hydrocarbyl containing one or more S, N, O, P or Si atoms, $C_4$-$C_{16}$ hydrocarbyl carbonyloxy, $C_4$-$C_{16}$ aryl(trialkylsiloxy) or both R' may form together with the 9-carbon on the fluorene ring a $C_5$-$C_{20}$ cyclic structure optionally containing one or more heteroatoms of S, N or O, the proportion of the first polymer in the polymer blend is at least 70 weight percent, and the triarylamine units of the second polymer include one or more types of triarylamine units selected from the group consisting of those according to the following formulae (IV), (V), and (VI):

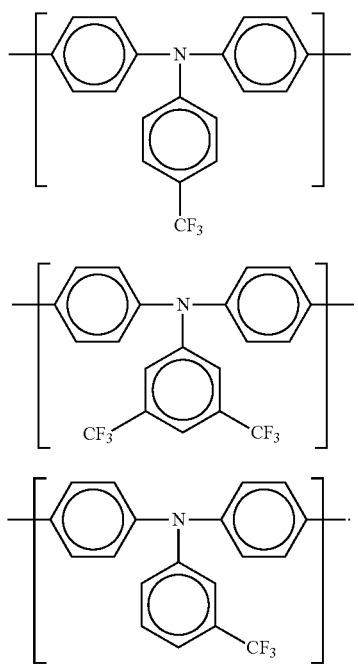

2. A polymer blend according to claim 1 wherein the proportion of the first polymer in the polymer blend is up to 75 weight percent.

3. A polymer blend according to claim 1 wherein the molecular weights of the polymers and the blending ratio of the polymers are selected such that, in use in a light-emissive device, the efficiency at a luminance of 30,000 cd/m² is no less than 70% of the peak efficiency.

4. A light-emissive device comprising a layer of a light-emissive material interposed between first and second electrodes such that charge carriers can move between the first and second electrodes and the light-emissive material, wherein the light-emissive material comprises a polymer blend according to claim 1.

5. A passive matrix display comprising a light-emissive device according to claim 4.

6. A polymer blend according to claim 1 comprising at least one third, hole transport polymer different from the second hole transport polymer consisting essentially of alternating substituted or non-substituted fluorene units according to formula (I) and substituted or non-substituted triarylamine units.

7. A polymer blend according to claim 6 comprising a fourth polymer, said fourth polymer comprising triarylamine units and fluorene units, the triarylamine units being different from those contained in the second polymer.

8. A polymer blend according to claim 7 wherein the triarylamine units contained in the fourth polymer include one or more triarylamine units selected from the group consisting of those according to the following formulae (III), (IV), (V), and (VI):

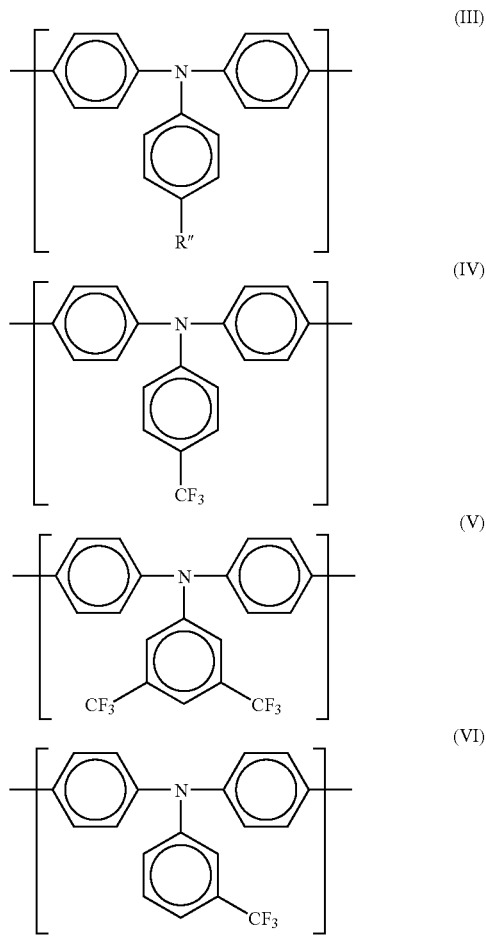

wherein R″ is independently in each occurrence carboxyl, $C_1$-$C_{20}$ alkyl, $C_1$-$C_{20}$ alkoxy or a group of the formula —$CO_2R'''$ wherein R′″ is a $C_1$-$C_{20}$ alkyl.

9. A light-emissive device comprising a light-emissive material interposed between first and second electrodes such that charge carriers can move between the first and second electrodes and the light-emissive material, wherein the light-emissive material comprises a layer of a polymer blend according to claim 1.

10. A light-emissive device according to claim 9 wherein the cathode comprises a layer of calcium, samarium, cerium or ytterbium.

11. A polymer blend according to claim 1 wherein the polymer blend consists essentially of the first and second polymers.

* * * * *